(12) United States Patent
Fukutomi et al.

(10) Patent No.: US 7,319,221 B2
(45) Date of Patent: Jan. 15, 2008

(54) LIGHT-RECEIVING DEVICE, OPTICAL PICKUP, AND OPTICAL DISC APPARATUS

(75) Inventors: Yoshio Fukutomi, Chiba (JP); Toru Nagara, Tokyo (JP)

(73) Assignee: Sony Corporation, Tokyo (JP)

( * ) Notice: Subject to any disclaimer, the term of this patent is extended or adjusted under 35 U.S.C. 154(b) by 126 days.

(21) Appl. No.: 11/407,311

(22) Filed: Apr. 18, 2006

(65) Prior Publication Data

US 2006/0231729 A1    Oct. 19, 2006

(30) Foreign Application Priority Data

Apr. 19, 2005  (JP)  ............................. 2005-121564
Jul. 27, 2005  (JP)  ............................. 2005-217309

(51) Int. Cl.
*H01J 40/14*      (2006.01)
*G11B 9/00*       (2006.01)
(52) U.S. Cl. .......................... 250/214 R; 250/214 A; 250/214 LS; 250/201.5; 369/124.12
(58) Field of Classification Search .......... 250/214 R, 250/214 A, 214 LA, 214 LS, 214 AG, 214 C, 250/201.5; 330/308, 59; 369/44.12, 44.14, 369/124.12, 124.13; 327/514
See application file for complete search history.

(56) References Cited

U.S. PATENT DOCUMENTS 5,936,231 A * 8/1999 Michiyama et al. ..... 250/214 A
2006/0170504 A1 * 8/2006 Kim et al. .................. 330/308

* cited by examiner

*Primary Examiner*—Kevin Pyo
(74) *Attorney, Agent, or Firm*—Wolf, Greenfield & Sacks, P.C.

(57) ABSTRACT

A signal-detecting light-receiving device formed as an integrated circuit, which receives a light beam reflected from an optical recording medium, and which outputs a signal obtained from the received reflected light beam, through a current-output-type current amplifier circuit. The light-receiving device includes the following components: at least one resistor configured as a part of the integrated circuit, the at least one resistor being an output resistor used as a termination resistor for an output terminal of the light-receiving device, the output terminal being connected to an output of the current amplifier circuit; and a selecting circuit configured as a part of the integrated circuit, which controls the at least one resistor so as to enable/disable connection of the at least one resistor to the output terminal of the light-receiving device.

12 Claims, 10 Drawing Sheets

LIGHT-RECEIVING DEVICE, OPTICAL PICKUP, AND OPTICAL DISC APPARATUS

CROSS REFERENCES TO RELATED APPLICATIONS

The present invention contains subject matter related to Japanese Patent Applications JP 2005-121564 and JP 2005-217309 filed in the Japanese Patent Office on Apr. 19, 2005 and Jul. 27, 2005, respectively, the entire contents of which are incorporated herein by reference.

BACKGROUND OF THE INVENTION

1. Field of the Invention

The present invention relates to light-receiving devices, optical pickups, and optical disc apparatuses. More particularly, the present invention relates to a current-output-type light-receiving device that enables signal transmission in which an effect of a decrease in output impedance is reduced at high frequency, and impedance matching is taken into account, an optical pickup and an optical disc apparatus both of which use the light-receiving device.

2. Description of the Related Art

A known optical disc apparatus such as a DVD or CD apparatus performs recording and playback operations on optical recording mediums using an optical pickup. The optical pickup is provided with a light-emitting device for emitting optical beams for the recording and playback operations, a driving device for outputting current that enables the light-emitting device to emit light, a signal-detecting light-receiving device for detecting signals, and an optical-beam-monitoring light-receiving device for monitoring the optical beams output from the light-emitting device. The signal-detecting light-receiving device is formed as a photodiode IC (hereinafter referred to as a "PDIC"). A front photodiode or a front photodiode IC formed as an integrated circuit is used as the optical-beam-monitoring light-receiving device.

Such an optical disc apparatus is desired to rapidly record and play back information on and from an optical disc. To this end, the optical disc apparatus is configured to rapidly record and play back information by rotating the optical disc using a rotation driving mechanism. More specifically, for example, the optical disc is configured to rapidly record and play back information on and from the optical disc by increasing a rotational speed for rotating the optical disc to a ×8 or ×16 rotational speed in comparison with a predetermined rotational speed, as well as increasing a maximum operation speed of the light-emitting device, the driving device, and the light-receiving device.

In the optical pickup with which information read out from the optical disc is output from the PDIC as a high-speed signal, and in the optical disc apparatus using the optical pickup, the PDIC is connected to a signal processing system including a signal demodulator and an error correction circuit by a relatively long signal line, whereby a signal waveform degrades when a signal passes through the signal line.

As means for preventing such degradation of signal waveforms, an optical pickup and an optical disc apparatus that prevent ringing in a high-speed pulse signal output from the PDIC exist (see, for example, Japanese Unexamined Patent Application Publication No. 2003-132548).

On the other hand, a high-performance PDIC that applies a CMOS process has also been considered instead of the known widely used PDIC that applies a Bipolar process.

SUMMARY OF THE INVENTION

However, the PDIC applying the CMOS process can be relatively more easily designed to output current rather than voltage as an output signal owing to characteristics of the CMOS process. In a case where rapid recording and playback operations are performed on an optical disc using this current-output-type PDIC, a high-frequency signal is transmitted via a relatively long signal line by means of current. Accordingly, unless impedance components in an output unit of the PDIC are sufficiently large, characteristics of a signal having been transmitted undesirably degrade at high frequency by being affected by parasitic components according to the signal line, an input capacitance of an IC connected to a subsequent stage of the signal line, etc.

It is desirable to provide an optical pickup and an optical disc apparatus enabling signal transmission in which an effect of a decrease in output impedance at high frequency is reduced, and impedance matching is taken into account.

According to an embodiment of the present invention, there is provided a signal-detecting light-receiving device formed as an integrated circuit, which receives a light beam reflected from an optical recording medium, and which outputs a signal obtained from the received reflected light beam, through a current-output-type current amplifier circuit. The light-receiving device includes the following components: at least one resistor configured as a part of the integrated circuit, the at least one resistor being an output resistor used as a termination resistor for an output terminal of the light-receiving device, the output terminal being connected to an output of the current amplifier circuit; and a selecting circuit configured as a part of the integrated circuit, which controls the at least one resistor so as to enable/disable connection of the at least one resistor to the output terminal of the light-receiving device.

According to an embodiment of the present invention, there is further provided an optical pickup including a signal-detecting light-receiving device formed as an integrated circuit, the light-receiving device receiving a light beam reflected from an optical recording medium, and outputting a signal obtained from the received reflected light beam, through a current-output-type current amplifier circuit. The optical pickup receives an output signal via a signal line connected to the current amplifier circuit of the light-receiving device. The light-receiving device provided in the optical pickup includes the following components: at least one resistor configured as a part of the integrated circuit, the at least one resistor being an output resistor used as a termination resistor for an output terminal of the light-receiving device, the output terminal being connected to an output of the current amplifier circuit; and a selecting circuit configured as a part of the integrated circuit, which controls the at least one resistor so as to enable/disable connection of the at least one resistor to the output terminal of the light-receiving device.

According to an embodiment of the present invention, there is further provided an optical disc apparatus including an optical pickup provided with a signal-detecting light-receiving device formed as an integrated circuit, the light-receiving device receiving a light beam reflected from an optical recording medium, and outputting a signal obtained from the received reflected light beam, through a current-output-type current amplifier circuit. The optical disc apparatus receives an output signal via a signal line that connects the current amplifier circuit of the light-receiving device to a signal processing circuit. The light-receiving device provided in the optical pickup in the optical disc apparatus includes the following components: at least one resistor configured as a part of the integrated circuit, the at least one resistor being an output resistor used as a termination resistor for an output terminal of the light-receiving device, the output terminal being connected to an output of the current amplifier circuit; and a selecting circuit configured as a part of the integrated circuit, which controls the at least one resistor so as to enable/disable connection of the at least one resistor to the output terminal of the light-receiving device.

According to the above-described light-receiving device, optical pickup, and optical disc apparatus according to an embodiment of the present invention, connection of the at least one resistor to an output unit of the light-receiving device is controlled to be enabled/disabled in the light-receiving device. In addition, when the connection of the at least one resistor to the output unit is enabled, resistance of the at least one resistor, connection of which has been enabled, is set as an output resistance. Consequently, in a case where the output resistance is set to a relatively small value, a signal output from the current-output-type PDIC is equivalently transmitted via the signal line as a voltage signal. Accordingly, there can be provided a light-receiving device, an optical pickup, and an optical disc apparatus that can reduce effects of a decrease in output impedance of the PDIC at high frequency and parasitic components according to the signal line, etc., upon characteristics of a signal having been transmitted at high frequency.

Furthermore, resistance of the output resistor connected to the output unit of the light-receiving device can be variably controlled in the light-receiving device in a state that resistance of an internal resistor in a signal processing circuit on a receiving side or a termination resistor disposed adjacent to an input of an IC connected to a subsequent stage of the light-receiving device is fixed. Accordingly, there can be provided a light-receiving device, an optical pickup, and an optical disc apparatus that can finely control characteristics and gain of a signal having been transmitted via a relatively long signal line at high frequency.

DESCRIPTION OF THE PREFERRED EMBODIMENT

In an embodiment of the present invention, for example, in order to reduce effects of a decrease in output impedance of a current-output-type PDIC at high frequency, and parasitic inductance components and parasitic capacitance components according to a signal line, upon characteristics of a signal having been transmitted via the signal line, a termination resistor that can be considered as an output resistor for an output terminal of the PDIC is disposed inside or outside the PDIC. The termination resistor is configured, such that connection/disconnection thereof as a circuit component is controlled if necessary, whereby enabling/disabling of connection thereof can be selected. In addition, the termination resistor is configured, such that resistance thereof is selected so as to correspond to a characteristic impedance Z0 of the signal line when connection of the termination resistor is enabled.

Characteristics of a reception signal to be received by a receiving side can be finely controlled by the following processes: fixing resistance of a termination resistor disposed adjacent to a front-end IC connected to a subsequent stage of the PDIC; and then changing and controlling resistance of the termination resistor disposed inside or outside the PDIC.

Figure 1:
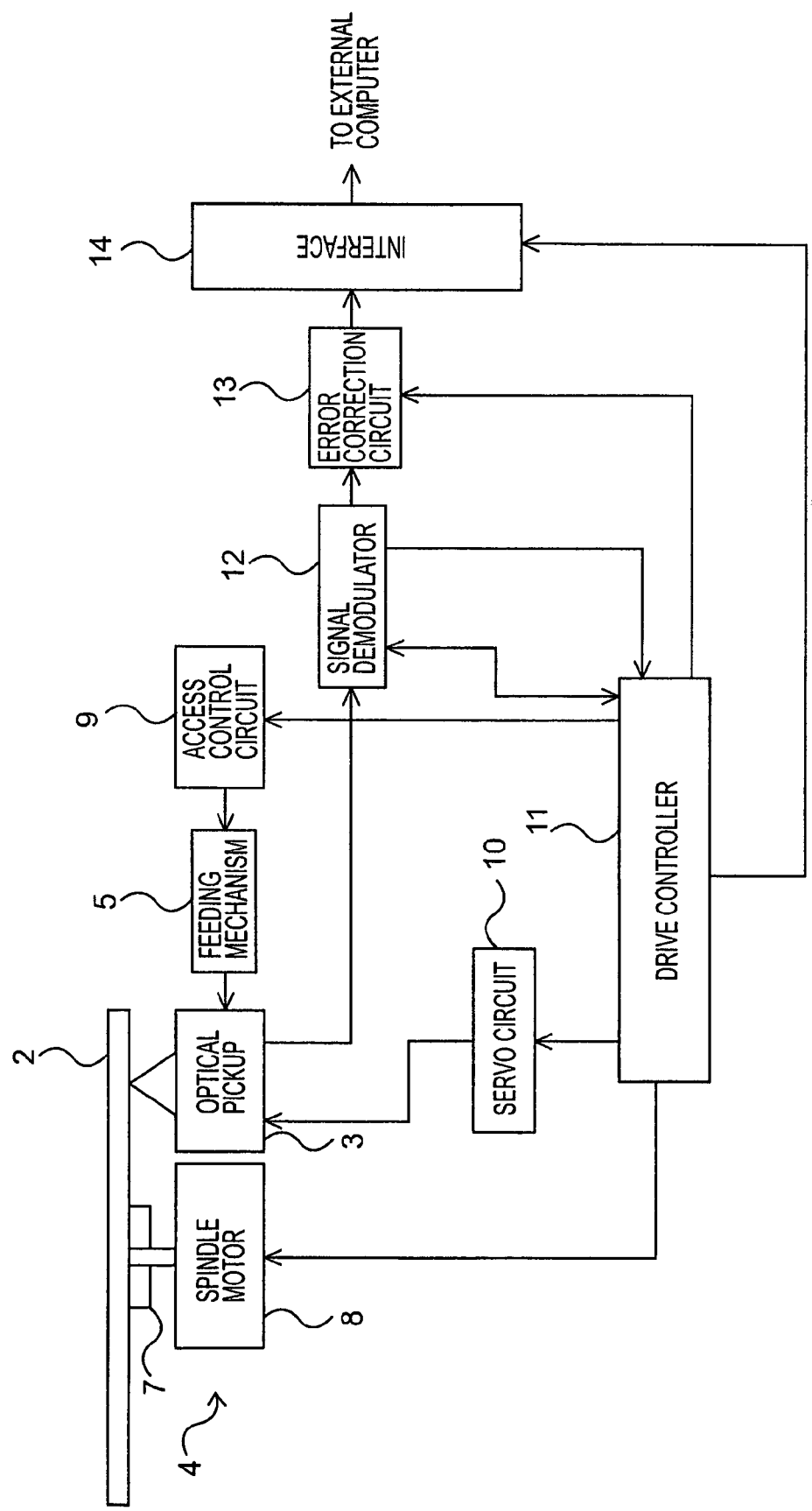
FIG. 1 is a block diagram showing a configuration of an optical disc apparatus provided with an optical pickup that uses a PDIC according to an embodiment of the present invention.
Figure 2:
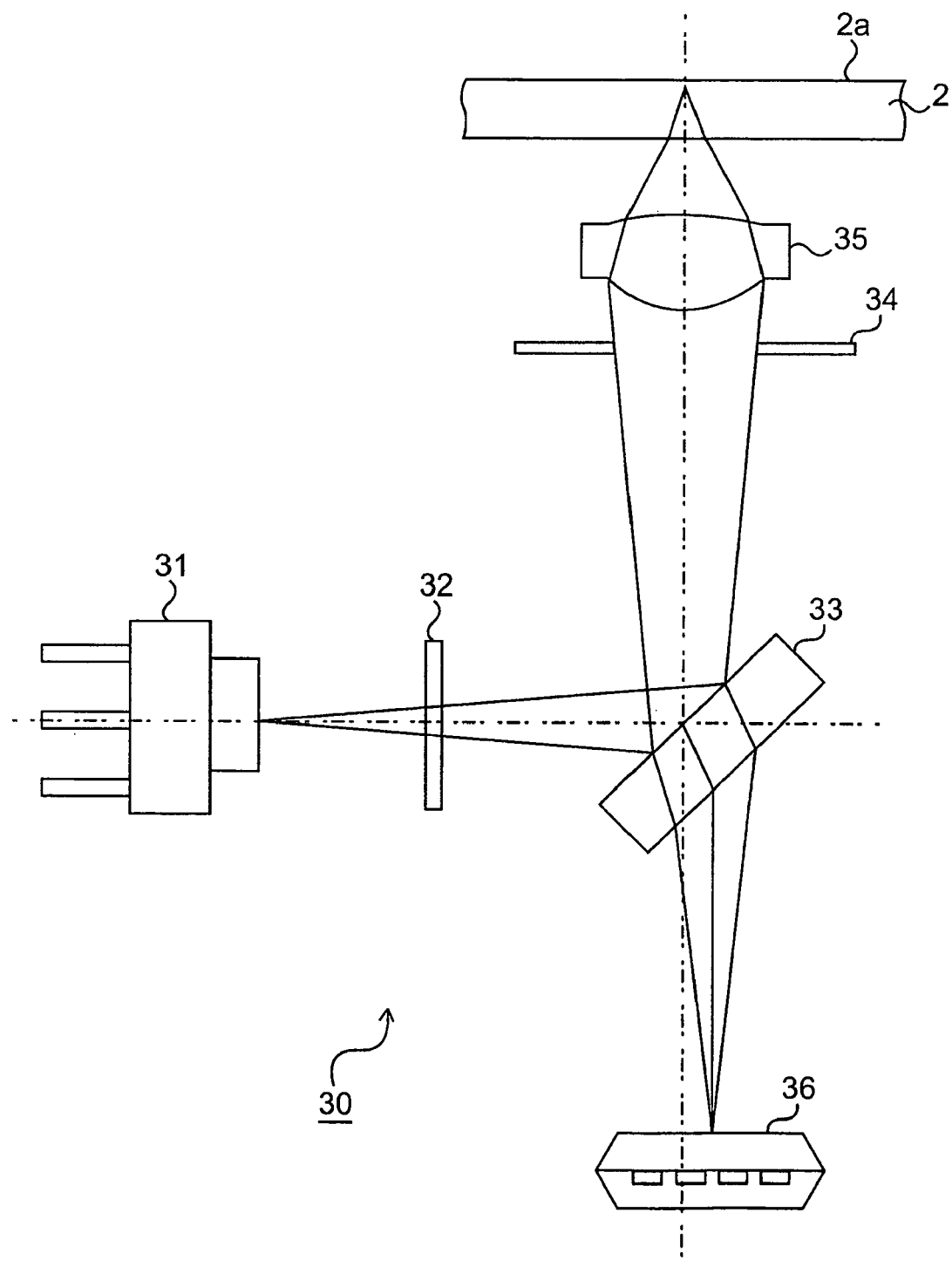
FIG. 2 is a schematic diagram illustrating a configuration of an optical system of an optical pickup according to an embodiment of the present invention.
Figure 3:
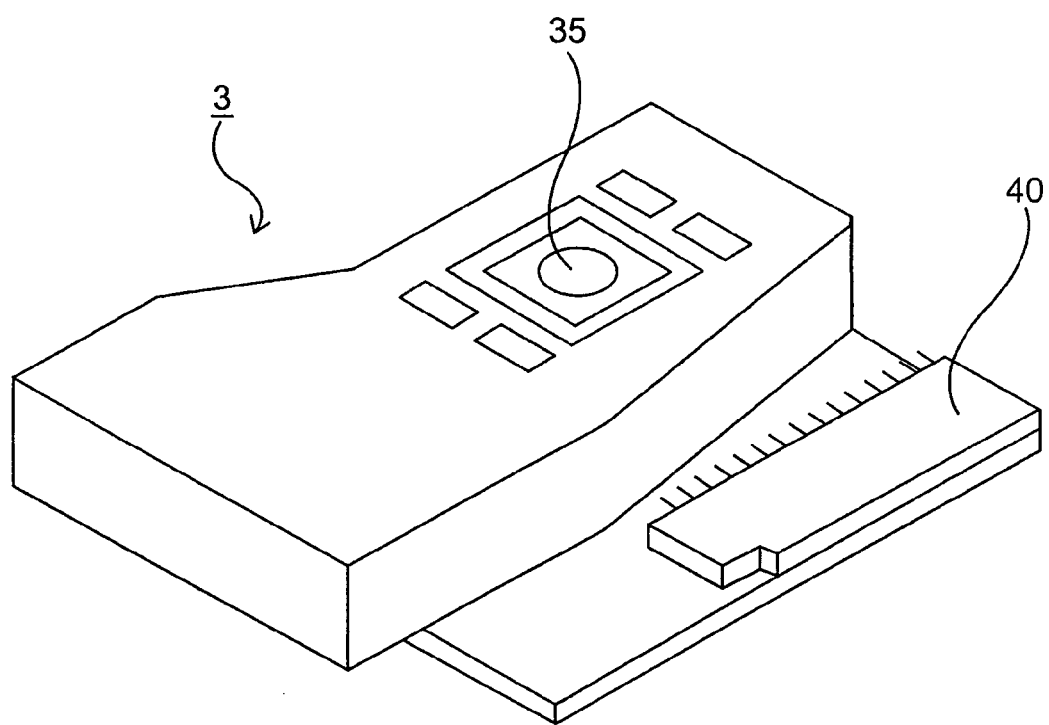
FIG. 3 is a perspective view illustrating an overview of an optical pickup according to an embodiment of the present invention.
Figure 4:
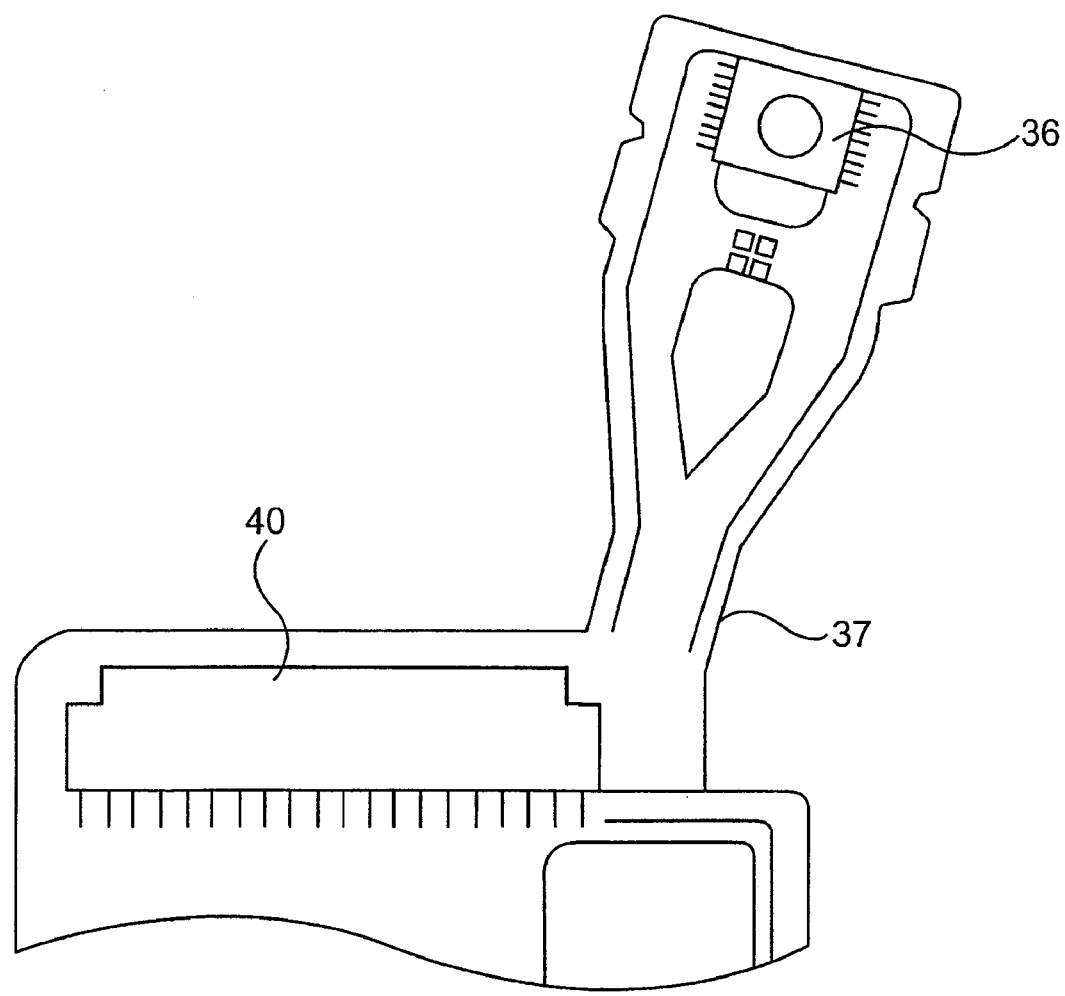
FIG. 4 is a schematic diagram illustrating association between a PDIC provided in an optical pickup according to an embodiment of the present invention and a flexible substrate.

FIG. 1 is a block diagram showing a configuration of an optical disc apparatus provided with an optical pickup that uses a PDIC according to an embodiment of the present invention. FIG. 2 is a schematic diagram illustrating a configuration of an optical system of the optical pickup shown in FIG. 1. FIG. 3 is a perspective view illustrating an overview of the optical pickup shown in FIG. 1. FIG. 4 is a schematic diagram illustrating an association between the PDIC provided in the optical pickup shown in FIG. 1 and a flexible substrate that becomes part of the PDIC and a signal line.

Referring to FIG. 1, the optical disc apparatus 1 is provided with an optical pickup 3 for recording and playing back information on and from an optical disc 2, a disc rotation driving mechanism 4 for rotating the optical disc 2, a feeding mechanism 5 for moving the optical pickup 3 in the radial direction of the optical disc 2, and a control unit for controlling the optical pickup 3, the disc rotation driving mechanism 4, and the feeding mechanism 5.

The disc rotation driving mechanism 4 is provided with a disc table 7 on which the optical disc 2 is set and a spindle motor 8 for rotating the disc table 7, thereby enabling rotation of the optical disc 2. The feeding mechanism 5 is provided with a supporting base (not shown) for supporting the optical pickup 3, a main shaft and a lay shaft (not shown)

for movably supporting the supporting base, and a thread motor (not shown) for moving the supporting base.

The control unit is provided with an access control circuit 9 for controlling a position of the optical pickup 3 in the radial direction of the optical disc 2 by performing drive control on the feeding mechanism 5, a servo circuit 10 for performing drive control on a two-axis actuator of the optical pickup 3, and a drive controller 11 for controlling the access control circuit 9 and the servo circuit 10. In addition, this control unit is provided with a signal demodulation circuit (signal processing circuit) 12 for performing demodulation processing on a signal transmitted from the optical pickup 3, an error correction circuit (signal processing circuit) 13 for performing error correction on the demodulated signal, and an interface 14 for outputting the error-corrected signal to an electronic apparatus such as an external computer.

The optical disc apparatus 1 having the above-described configuration records and plays back information on and from the optical disc 2 by rotating the disc table 7 on which the optical disc 2 has been set using the spindle motor 8 included in the disc rotation driving mechanism 4, and then performing drive control on the feeding mechanism 5 in accordance with a control signal transmitted from the access control circuit 9, and then moving the optical pickup 3 to a position corresponding to a desired recording track of the optical disc 2.

As illustrated in FIG. 2, the optical pickup 3 is provided with an optical system 30 for playing back or recording information from or on the optical disc 2 and a lens driving mechanism for driving and displacing an objective lens provided to the optical system 30. The optical system 30 is provided with, in order of deposition along an optical path, a light source 31 for emitting laser beams, a diffraction grating 32 for dividing the emitted light from the light source 31, a beam splitter 33 for reflecting the emitted light having been divided by the diffraction grating 32 and then transmitting light received from the optical disc 2, an aperture diaphragm 34 for limiting the emitted light having been reflected by the beam splitter 33 to the predetermined number of apertures, an objective lens 35 for focusing the emitted light having been limited by the aperture diaphragm 34 to a signal recording surface 2a of the optical disc 2 and then gathering the light returned from the optical disc 2, and a PDIC 36 for receiving the returned light, the returned light having been transmitted through the beam splitter 33, and then generating various signals.

As illustrated in FIGS. 3 and 4, in the optical disc apparatus 1 according to this embodiment, a signal output from the PDIC 36 included in the optical pickup 3 is output from a connector 40 via a flexible substrate 37. The PDIC 36 outputs a current signal as an output and contains such a termination resistor that can be considered as an output resistor for an output terminal. A plurality of termination resistors are provided in the PDIC 36 and are configured, such that connection/disconnection or resistance thereof can be changed using switching circuits.

As described above, in a known optical pickup, in a case where a current-output-type PDIC is applied, a signal is transmitted via a signal line configured by a relatively long flexible substrate, etc. by means of current. Therefore, unless output impedance of the PDIC is sufficiently large in a signal band, characteristics of a signal having been transmitted degrade at high frequency owing to parasitic components according to the signal line. However, in the known current-output-type PDIC, it is actually extremely difficult to prevent the degradation of output impedance at high frequency owing to an effect of a parasitic capacitance for an output unit of the PDIC. Because of the configuration of the optical pickup in which the optical pickup is movable, a relatively long flexible substrate has to be used. In addition, the optical disc apparatuses have recently been expected to operate at high speeds. In view of these facts, the degradation of characteristics of a transmitted signal has to be reduced across a wide band, even if a signal is transmitted via a long signal line.

Subsequently, a method of reducing the effects of a decrease in output impedance of the PDIC 36 and parasitic components according to signal wiring, on characteristics of a transmitted signal at high frequency in the above-described optical pickup 3 will be described.

Figure 5:
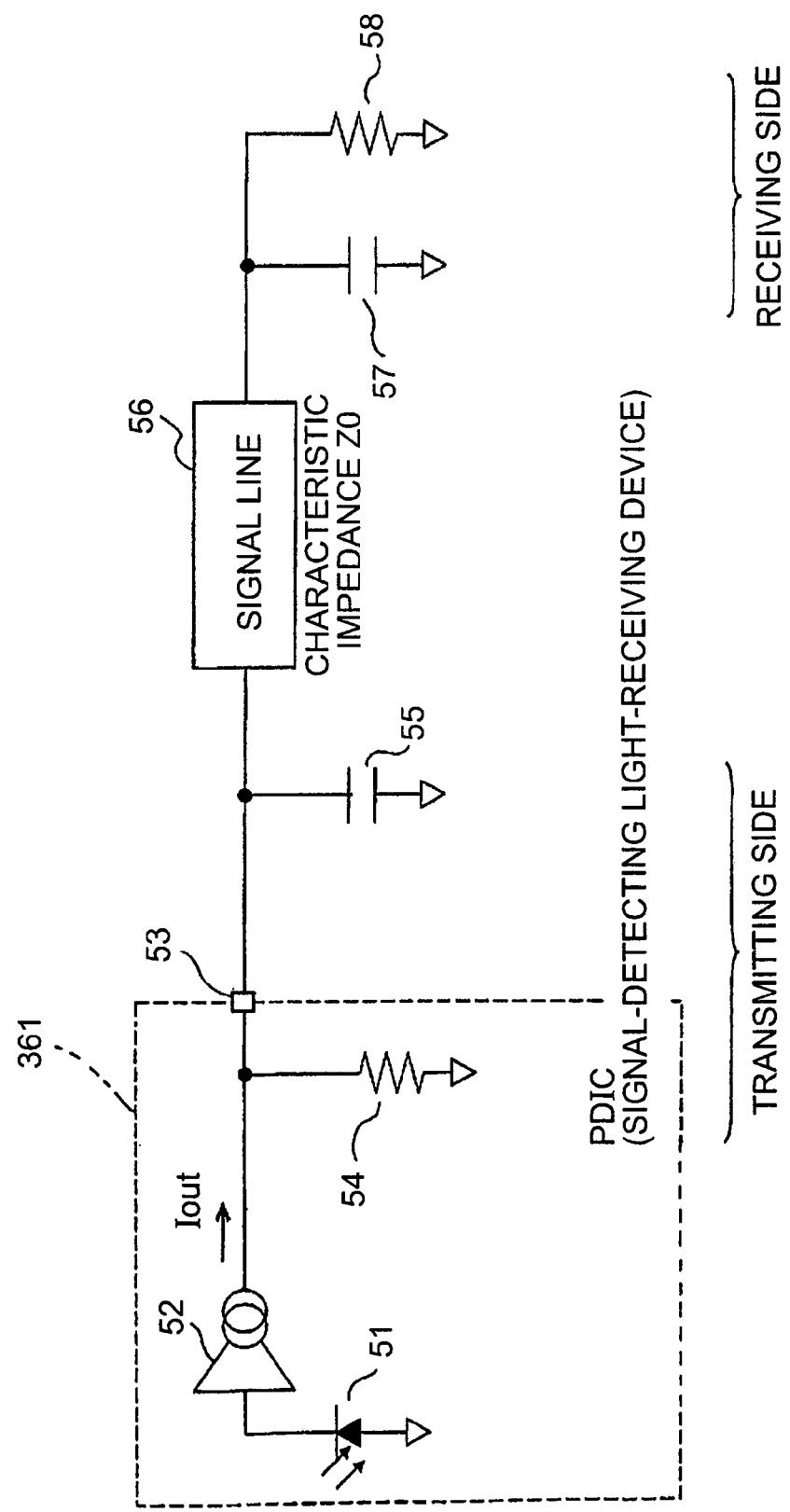
FIG. 5 is a diagram showing a simple electric equivalent circuit from a PDIC to a receiving side.

FIG. 5 is a diagram showing an output resistor of the PDIC, a parasitic capacitance of the substrate, and an input capacitance parasitizing a mounting substrate and an input of a front-end IC (not shown) in the known current-output-type PDIC, when a signal having been output from the PDIC on a transmitting side is transmitted via the signal line into the front-end IC at a subsequent stage or to a termination resistor disposed adjacent to the input of the front-end IC. A known current-output-type PDIC 361 is provided with a photodiode (hereinafter referred to as a "PD") 51, a current amplifier circuit 52, and an output resistor 54 for an output terminal 53 of the PDIC 361. The PD 51 receives reflected light from the optical disc and then converts the received light into a current signal. The current of the current signal is amplified by the current amplifier circuit 52 and is then output from the output terminal 53 as a current signal.

Since resistance of the output resistor 54 is generally an extremely high value, the PDIC 361 can be considered as an ideal current source at low frequency. Accordingly, almost all output current Iout from the current amplifier circuit 52 is output from the output terminal 53. This output current Iout is connected to the front-end IC (not shown) at a subsequent stage, which contains the signal demodulator 12 and the servo circuit 10, etc., illustrated in FIG. 1, via a signal line 56 configured by a flexible substrate of a characteristic impedance Z0, etc., while being affected by a parasitic capacitance 55 that parasitizes an output of the PDIC 361 and the mounting substrate. An input capacitance 57 parasitizes an input of the front-end IC and the mounting substrate. A termination resistor 58 is disposed in the front-end IC or adjacent to the input of the front-end IC.

Figure 6:
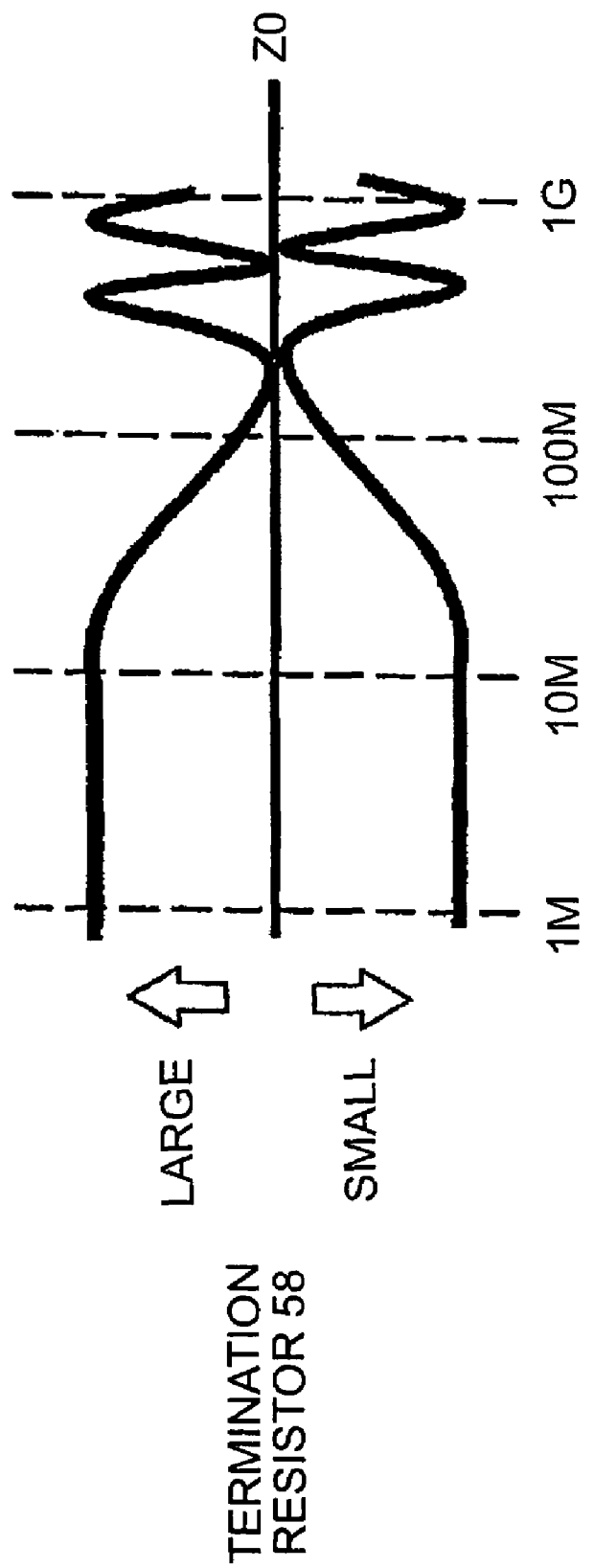
FIG. 6 is a diagram showing how signal characteristics on a receiving side are affected by changes in resistance of an internal resistor of a front-end IC or a termination resistor disposed adjacent to an input of the front-end IC.

FIG. 6 is a diagram showing an effect of an association between a value of the characteristic impedance Z0 of the signal line 56 and resistance of the termination resistor 58 shown in FIG. 5, on frequency characteristics of a reception signal, when output impedance determined in accordance with the output resistor 54 and the parasitic capacitance 55 is sufficiently enough in a signal band.

As shown in FIG. 6, when the output impedance determined in accordance with the output resistor 54 and the parasitic capacitance 55 is sufficiently enough in a signal band, ideal signal transfer characteristics can be obtained by setting the resistance of the termination resistor 58 to the value of the characteristic impedance Z0 of the signal line 56. On the other hand, when the resistance of the termination resistor 58 is set to a value larger than that of the characteristic impedance Z0, a signal level becomes larger at low frequency, but begins to fall at an arbitrary frequency. When the resistance of the termination resistor 58 is set to a value smaller than that of the characteristic impedance Z0 of the signal line 56, the signal level becomes smaller at low frequency, and begins to rise at an arbitrary frequency. In the latter case, peaking exists in frequency characteristics.

Reflection due to impedance mismatching causes these changes in frequency characteristics.

As described above, at low frequency, since the resistance of the output resistor 54 is high, and since a signal wavelength is long, the reflection due to the impedance mismatching has no effect on a reception signal. However, at high frequency, since the output impedance of an output unit of the PDIC 361 on the transmitting side decreases owing to an effect of the parasitic capacitance 55, and since it is difficult to disregard the length of the signal line 56 relative to the signal wavelength, the reflection due to the impedance mismatching actually has an effect on the reception signal.

Figure 7:
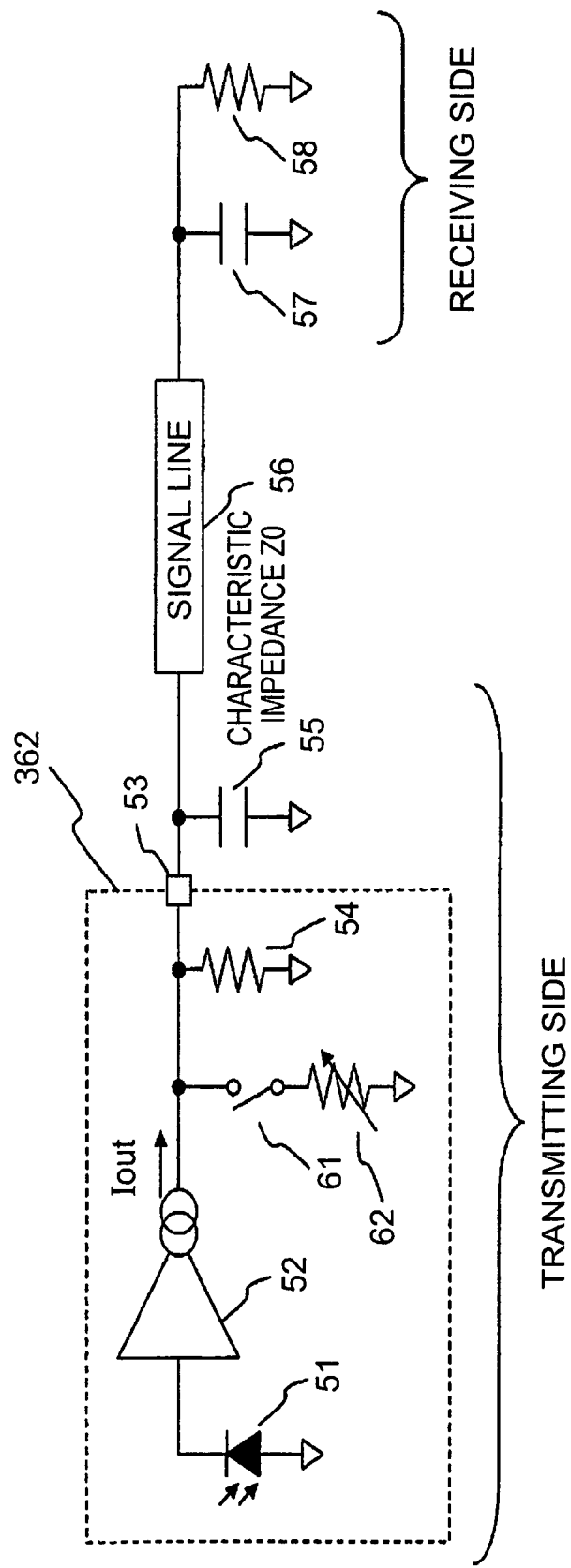
FIG. 7 is a diagram showing a configuration in which a variable resistor controlling output resistance of a PDIC is disposed in the PDIC, and the variable resistor is configured, such that the enabling/disabling of connection thereof and the resistance thereof can variably be controlled.

FIG. 7 is a diagram showing a configuration of a PDIC 362 according to this embodiment that enables, taking the effects of output impedance changes on the transmitting side, upon the frequency characteristics on the receiving side into account, resistance of the output resistor 54 shown in FIG. 5 to be controlled by an output resistor for controlling, which is disposed in the PDIC.

In FIG. 7, the same reference numbers are used for components similar to those of FIGS. 5 and 6. Referring to FIG. 7, resistance of the termination resistor 58 approximately corresponds to a value of the characteristic impedance Z0 of the signal line, whereby impedance matching on the receiving side can be maintained, so that required characteristics of a reception signal can be ensured even if at high frequency. The value of the characteristic impedance of the signal line 56 actually being used is about 100Ω. As shown in FIG. 7, the PDIC 362 according to this embodiment is different from the known PDIC 361 in that a variable resistor 62, the conductive/nonconductive state of which can be controlled by a switching circuit 61, is provided in the PDIC 362. In the PDIC 362, when the impedance mismatching on the transmitting side, which is due to a decrease in output impedance on the transmitting side occurring owing to effects of the output resistor 54 and the parasitic capacitance 55, does not lead to a problem, an output signal is transmitted by means of current after the switching circuit 61 is controlled so as to be in the nonconductive state, such that connection of the variable resistor 62 is disabled (open). However, when it is difficult to disregard the decrease in output impedance on the transmitting side in a signal band, the switching circuit 61 is controlled so as to be in the conductive state, such that connection of the variable resistor 62 is enabled. In addition, the resistance of the variable resistor 62 is controlled so as to approximately correspond to the value of the characteristic impedance Z0 of the signal line 56. In this case, since the value of the characteristic impedance Z0 of the signal line 56 is relatively small, the resistance of the variable resistor 62 becomes dominant in the output resistance for the output terminal 53, whereby a time constant obtained by the output resistance of the PDIC 362 and the parasitic capacitance 55 becomes small. Accordingly, the effect of a decrease in output impedance of the PDIC 362 is reduced at high frequency. Since output impedance on the transmitting side can be approximately the same as the value of the characteristic impedance Z0 in a signal band, impedance matching is similarly maintained on the transmitting side, whereby the degradation of characteristics of the reception signal to be received by the input unit of the front-end IC can be prevented.

However, in this case, it should be noted that amplitude of a signal to be input into the front-end IC at the subsequent stage becomes half of that when connection of the variable resistor 62 is disabled in the PDIC 362.

Since the variable resistor 62 is variable, the output impedance on the transmitting side can vary according to the characteristic impedance Z0 that varies with conditions of a cable curvature, a wiring pattern, and a GND pattern around a cable, whereby signal characteristics on the receiving side can be finely controlled. In addition, the output current Iout is converted into a voltage signal by the variable resistor 62 in the PDIC 362. From these facts, gain of the reception signal can be controlled by changing the resistance of the variable resistor 62 without causing an adverse effect on the signal characteristics on the receiving side.

Figure 8:
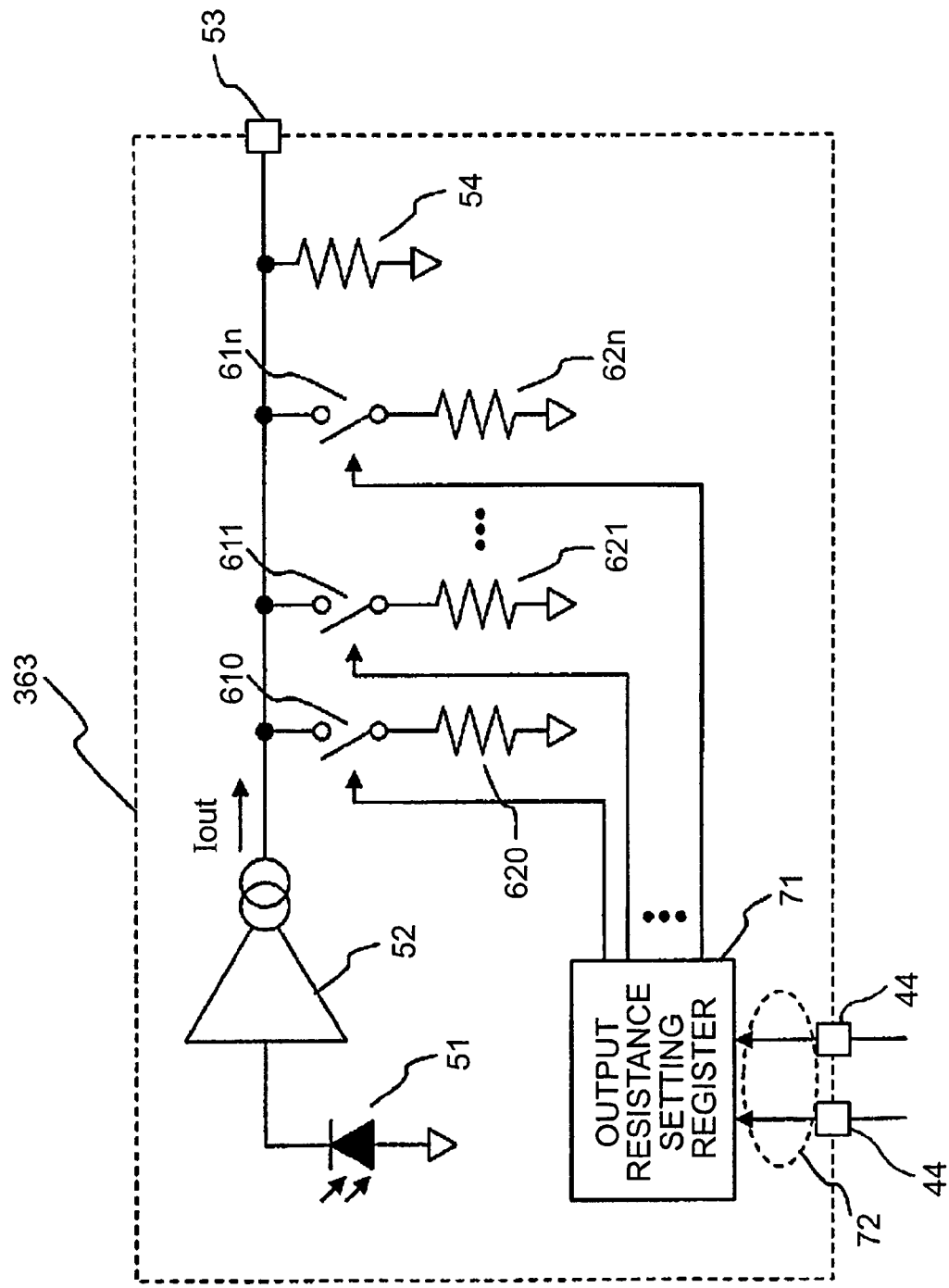
FIG. 8 is a block diagram showing a configuration allowing controlling of the enabling/disabling of connection of an output resistor and the resistance thereof in a PDIC provided in an optical pickup according to an embodiment of the present invention.

FIG. 8 shows a specific example of a circuit embodying the function shown in FIG. 7. In FIG. 8, the same reference numbers are also used for components similar to those of FIGS. 5, 6, and 7. FIG. 8 is a block diagram showing a configuration allowing enabling/disabling of connection of the variable resistor 62 shown in FIG. 7 and resistance thereof to be controlled by making it possible to select one of a plurality of resistors 620, 621, . . . , and 62$n$ using a corresponding switching circuit 610, 611, . . . , or 61$n$. Here, resistances of the resistors 620, 621, . . . , and 62$n$ may be identical or different from each other. A plurality of resistors 620, 621, . . . , and 62$n$ is equivalent to the variable resistor 62 disposed in the PDIC 362 shown in FIG. 7. Thus, the output resistance of the PDIC 363 is set so as to be approximately equal to the value of the characteristic impedance Z0 of the signal line 56 by controlling the switching circuits 610, 611, . . . , and 61$n$. As shown in FIG. 8, the current amplifier circuit 52 receives an output of the photodiode 51. Like the case in FIG. 7, when the impedance mismatching on the transmitting side, which is due to a decrease in output impedance on the transmitting side occurring owing to effects of the output resistor 54 and the parasitic capacitance 55, does not lead to a problem, all of the switching circuits 610, 611, . . . , and 61$n$ are controlled so as to be in the nonconductive states. However, when the decrease in output impedance on the transmitting side leads to a problem, the switching circuits 610, 611, . . . , and 61$n$ are controlled, such that output resistance for the output terminal 53 of the PDIC 363 approximately corresponds to the value of the impedance Z0 of the signal line by combining the conductive/nonconductive states thereof. Consequently, a signal can be transmitted without the degradation of characteristics thereof even at high frequency. Here, the conductive/nonconductive states of the switching circuits 610, 611, . . . , and 61$n$ are controlled on the basis of corresponding output resistance setting data stored in an output resistance setting register (holding circuit) 71 provided in the PDIC 363. Consequently, connection of one or more of the resistors 620, 621, . . . , and 62$n$ is enabled, and the resistance thereof corresponds to the resistance of the variable resistor 62 shown in FIG. 7. The output resistance setting data stored in the output resistance setting register 71 can generally be externally wrote using output resistance setting signals 72 input from a plurality of input units 44.

In the example in FIG. 8, the conductive/nonconductive states of the switching circuits 610, 611, . . . , and 61$n$ for setting output resistance are controlled by the output resistance setting register 71. However, as a PDIC 364 shown in FIG. 9, each of the switching circuits 610, 611, . . . , and 61$n$ may have a single output resistance setting signal 72 and a single output unit 44 for the signal. In this case, the conductive/nonconductive state of each of the switching circuits may be selected in accordance with the level of the output resistance setting signal.

Figure 9:
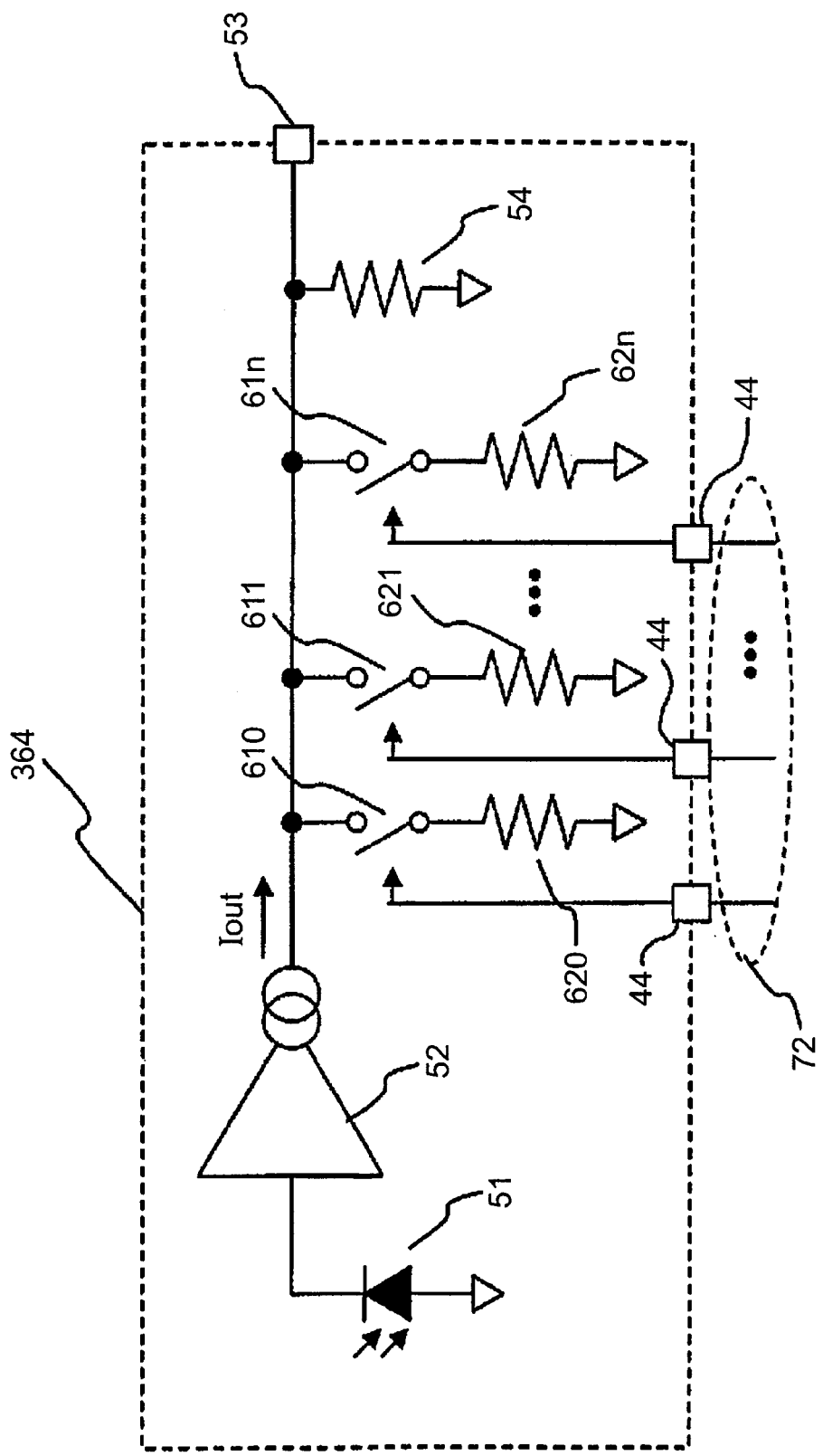
FIG. 9 is a block diagram showing another configuration allowing controlling of the enabling/disabling of connection of an output resistor and the resistance thereof in a PDIC provided in an optical pickup according to an embodiment of the present invention.

The resistance of each of the variable resistor 62 and the resistors 620, 621, . . . , and 62$n$ in FIGS. 7, 8, and 9 has to be prevented from changing by being affected by heat or the like.

Although the output resistor 54, the termination resistor 58, the variable resistor 62 and the resistors 620, 621, . . . , and 62n are connected to GND in FIGS. 5, 7, 8, and 9, these resistors may be connected to a reference voltage.

As described above, in a case where the current-output-type PDIC is used, in order to reduce the effects of a decrease in output impedance of the PDIC and parasitic components according to the signal line, etc., on characteristics of a signal having been transmitted at high frequency, the following solutions are effective: disposing at least one termination resistor, which is generally disposed adjacent to the output of the PDIC, in the PDIC as an output resistor for the PDIC; configuring the at least one output resistor, such that connection/disconnection thereof as a circuit component can be controlled if necessary, whereby enabling/disabling of connection thereof can be selected; and further configuring the at least one output resistor, such that resistance thereof can be selected so as to correspond to the value of the characteristic impedance Z0 of the signal line when connection of the at least one output resistor is enabled. In addition, in this case, it is effective to set the resistance of the internal resistor of the front-end IC or the termination resistor disposed adjacent to the input of the front-end IC to the value corresponding to the resistance of at least one output resistor, which has been selected so as to be equal to the value of the characteristic impedance Z0 of the signal line.

Since the internal resistor in the front-end IC or the termination resistor 58 disposed adjacent to the input of the front-end IC is IC-specific or is implemented by a chip resistor, it is very difficult to independently control each resistance of the resistors when they are mass-produced. Therefore, the characteristics of a reception signal such as frequency characteristics, gain, etc. can be finely controlled by the following processes: fixing the resistance of the termination resistor 58 to a value that approximately corresponds to the value of the characteristic impedance Z0 of the signal line; and then controlling the output resistance in the PDIC using the variable resistor.

Accordingly, in this embodiment, as shown in FIGS. 8 and 9, the PDIC is configured as follows: a plurality of resistors each having a different resistance are disposed in the PDIC; each of the resistors is connected to the switching circuits, the conductive/nonconductive states of which are controlled by the output resistance setting signals; the switching circuits are configured, such that the conductive/nonconductive states thereof can be controlled from outside the PDIC using the output resistance setting signals; the enabling/disabling of the connection of each of the resistors for the output unit of the PDIC is controlled by the switching circuits in the PDIC; and when connection of one or more of the resistors is enabled, the resistance of the enabled one or more of the resistors is set as the output resistance.

Consequently, there can be provided a light-receiving device, an optical pickup, and an optical disc apparatus that can transmit a signal at high frequency preventing degradation of characteristics of a reception signal due to a decrease in output impedance of a PDIC, and can reduce the effects of a decrease in output impedance of the PDIC and parasitic components according to a signal line, etc., on the characteristics of the reception signal having been transmitted at high frequency.

Furthermore, there can be provided a light-receiving device, an optical pickup, and an optical disc apparatus that can finely control characteristics and gain of a reception signal at high frequency when the signal is transmitted via a relatively long signal line, by variably controlling resistance of an output resistor in a PDIC in such a state that resistance of an internal resistor in a front-end IC on a receiving side or the termination resistor 58 disposed adjacent to an input of the front-end IC is fixed.

As described above, the PDIC is configured as follows: a plurality of resistors 620, 621, . . . , and 62n are disposed in the PDIC; the resistors are connected to the switching circuits 610, 611, . . . , and 61n, respectively, the conductive/nonconductive states of which are controlled by output resistance setting signals; and the conductive/nonconductive states of the switching circuits are controlled from outside the PDIC using the output resistance setting signals. However, these resistors and switching circuits may be configured as another integrated circuit being different from the PDIC. If such a configuration is applied, the known current-output-type PDIC 361 can be used without being replaced.

Figure 10:
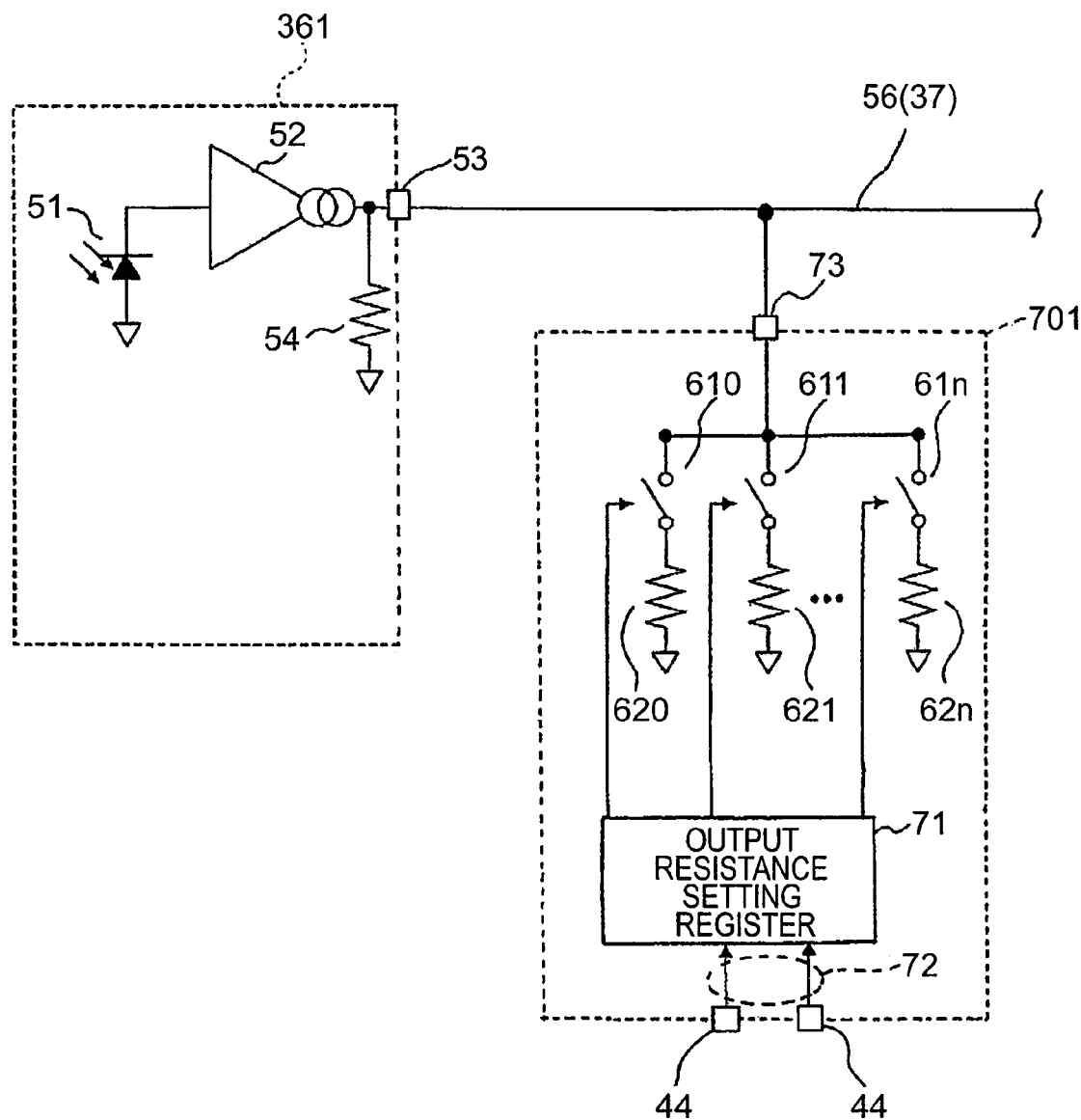
FIG. 10 is a block diagram showing a configuration allowing, outside a PDIC, controlling of the enabling/disabling of connection of an output resistor and the resistance thereof in the PDIC provided in an optical pickup according to an embodiment of the present invention.

FIG. 10 is a block diagram showing a configuration in which the resistors and the switching circuits are configured as another integrated circuit being different from the current-output-type PDIC 361, thereby making it possible to control the enabling/disabling of the connection of the output resistors and the output resistance thereof outside the PDIC. The same reference numbers are also used for same or equivalent components of FIGS. 5 and 8, and the description thereof is to be omitted.

In this configuration in which the enabling/disabling of the connection of the output resistors and the output resistance thereof can be controlled outside the PDIC, the switching circuits 610, 611, . . . , and 61n and the output resistance setting register 71 are configured as a control circuit 701 of the PDIC. The switching circuits 610, 611, . . . , and 61n control the resistors 620, 621, . . . , and 62n, respectively, so as to enable/disable connection of the resistors 620, 621, . . . , and 62n to the output terminal 53, using an output resistance setting signal on a transmitting side of the flexible substrate 37. The flexible substrate 37 is connected to the output terminal 53 of the PDIC. The output terminal 53 is connected to the output of the current amplifier circuit 52. When connection of one or more of these resistors 620, 621, . . . , and 62n is enabled, the resistance of the enabled one or more of the resistors is set as the resistance of the output resistor used as a termination resistor for the output terminal 53 of the PDIC. A connecting portion 73 is used for connecting one end of each of the switching circuits 610, 611, . . . , and 61n to the transmitting side of the flexible substrate 37. Consequently, when connection of one or more of these resistors 620, 621, . . . , and 62n is enabled, the resistance of the enabled one or more of the resistors is set as the resistance of the output resistor used as a termination resistor for the output terminal 53 of the PDIC.

The known current-output-type PDIC 361 and the control circuit 701 formed as an integrated circuit, in which the resistors 620, 621, . . . , and 62n, the switching circuits 610, 611, . . . , and 61n, and the output resistance setting register 71 are disposed, may be configured as a hybrid IC.

It should be understood by those skilled in the art that various modifications, combinations, sub-combinations and alterations may occur depending on design requirements and other factors insofar as they are within the scope of the appended claims or the equivalents thereof.

What is claimed is:

1. A signal-detecting light-receiving device formed as an integrated circuit, which receives a light beam reflected from an optical recording medium, and which outputs a signal obtained from the received reflected light beam, through a current-output-type current amplifier circuit, said light-receiving device comprising:

at least one resistor configured as a part of said integrated circuit, said at least one resistor being an output resistor used as a termination resistor for an output terminal of said light-receiving device, said output terminal being connected to an output of said current amplifier circuit; and a selecting circuit configured as a part of said integrated circuit, which controls said at least one resistor so as to enable/disable connection of said at least one resistor to said output terminal of said light-receiving device.

2. The light-receiving device according to claim 1, wherein said at least one resistor comprises a plurality of resistors, and
wherein said selecting circuit selects one or more of said plurality of resistors in accordance with an externally provided output resistance setting signal so that a combined resistance of said selected one or more resistors matches a desired value, and then enables connection of said selected one or more resistors to said output terminal of said light-receiving device.

3. The light-receiving device according to claim 2, further comprising:
an input unit for externally receiving said output resistance setting signal,
wherein said selecting circuit is provided with a holding circuit for storing said output resistance setting signal input from said input unit, and a switching circuit, a conductive/nonconductive state of which is controlled in accordance with said output resistance setting signal held in said holding circuit, and which is disposed between said output terminal of said light-receiving device and each of said plurality of resistors.

4. The light-receiving device according to claim 2, wherein said plurality of resistors are combined so that a combined resistance of said plurality of resistors matches a value of a characteristic impedance of a signal line connected to said current amplifier circuit.

5. An optical pickup comprising:
a signal-detecting light-receiving device formed as an integrated circuit, which receives a light beam reflected from an optical recording medium, and which outputs a signal obtained from the received reflected light beam, through a current-output-type current amplifier circuit, said optical pickup receiving an output signal via a signal line connected to said current amplifier circuit of said light-receiving device;
wherein said light-receiving device comprises:
at least one resistor configured as a part of said integrated circuit, said at least one resistor being an output resistor used as a termination resistor for an output terminal of said light-receiving device, said output terminal being connected to an output of said current amplifier circuit, and
a selecting circuit configured as a part of said integrated circuit, which controls said at least one resistor so as to enable/disable connection of said at least one resistor to said output terminal of said light-receiving device.

6. The optical pickup according to claim 5,
wherein said at least one resistor provided in said light-receiving device comprises a plurality of resistors, and
wherein said selecting circuit provided in said light-receiving device selects one or more of said plurality of resistors in accordance with an externally provided output resistance setting signal so that a combined resistance of said selected one or more resistors matches a desired value, and then enables connection of said selected one or more resistors to said output terminal of said light-receiving device.

7. The optical pickup according to claim 6,
wherein said light-receiving device further comprises an input unit for externally receiving said output resistance setting signal, and
wherein said selecting circuit is provided with a holding circuit for storing said output resistance setting signal input from said input unit, and a switching circuit, a conductive/nonconductive state of which is controlled in accordance with said output resistance setting signal held in said holding circuit, and which is disposed between said output terminal of said light-receiving device and each of said plurality of resistors.

8. The optical pickup according to claim 6, wherein said plurality of resistors are combined so that a combined resistance of said plurality of resistors matches a value of a characteristic impedance of a signal line connected to said current amplifier circuit.

9. An optical disc apparatus comprising:
an optical pickup provided with a signal-detecting light-receiving device formed as an integrated circuit, said light-receiving device receiving a light beam reflected from an optical recording medium, and outputting a signal obtained from the received reflected light beam, through a current-output-type current amplifier circuit, said optical disc apparatus receiving an output signal via a signal line that connects said current amplifier circuit of said light-receiving device to a signal processing circuit,
wherein said light-receiving device provided in said optical pickup comprises:
at least one resistor configured as a part of said integrated circuit, said at least one resistor being an output resistor used as a termination resistor for an output terminal of said light-receiving device, said output terminal being connected to an output of said current amplifier circuit, and
a selecting circuit configured as a part of said integrated circuit, which controls said at least one resistor so as to enable/disable connection of said at least one resistor to said output terminal of said light-receiving device.

10. The optical disc apparatus according to claim 9,
wherein said at least one resistor provided in said light-receiving device in said optical pickup comprises a plurality of resistors, and
wherein said selecting circuit provided in said light-receiving device in said optical pickup selects one or more of said plurality of resistors in accordance with an externally provided output resistance setting signal so that a combined resistance of said selected one or more resistors matches a desired value, and then enables connection of said selected one or more resistors to said output terminal of said light-receiving device.

11. The optical disc apparatus according to claim 10,
wherein said light-receiving device in said optical pickup further comprises an input unit for externally receiving said output resistance setting signal, and
wherein said selecting circuit is provided with a holding circuit for storing said output resistance setting signal input from said input unit, and a switching circuit, a conductive/nonconductive state of which is controlled in accordance with said output resistance setting signal held in said holding circuit, and which is disposed between said output terminal of said light-receiving device and each of said plurality of resistors.

12. The optical disc apparatus according to claim 10, wherein said plurality of resistors are combined so that a combined resistance of said plurality of resistors matches a value of a characteristic impedance of a signal line connected to said current amplifier circuit.

* * * * *